(12) United States Patent
Amemiya et al.

(10) Patent No.: US 6,645,707 B2
(45) Date of Patent: Nov. 11, 2003

(54) DEVICE MANUFACTURING METHOD

(75) Inventors: Mitsuaki Amemiya, Oomiya (JP); Shunichi Uzawa, Tokyo (JP); Keiko Chiba, Utsunomiya (JP); Yutaka Watanabe, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/534,334

(22) Filed: Mar. 24, 2000

(65) Prior Publication Data

US 2003/0143496 A1 Jul. 31, 2003

(30) Foreign Application Priority Data

Mar. 29, 1999 (JP) .............................. 11-085862

(51) Int. Cl.$^7$ ................................ G03C 5/56
(52) U.S. Cl. ...................... 430/394; 430/396; 430/296; 430/311; 430/312; 430/313
(58) Field of Search ................. 430/311, 312, 430/313, 394, 396, 296

(56) References Cited

U.S. PATENT DOCUMENTS 5,008,702 A  *  4/1991 Tanaka et al. ................ 355/52
5,432,044 A  *  7/1995 Shimizu ....................... 430/269
6,272,202 B1 *  8/2001 Chiba et al. .................. 378/34

FOREIGN PATENT DOCUMENTS

| JP | 7-77796 | 3/1995 |
| JP | 9-236930 | 9/1997 |
| JP | 10-78647 | 3/1998 |
| JP | 11-143085 | 5/1999 |

* cited by examiner

*Primary Examiner*—Mark F. Huff
*Assistant Examiner*—Daborah Chacko-Davis
(74) *Attorney, Agent, or Firm*—Fitzpatrick, Cella, Harper & Scinto (57) ABSTRACT

A device manufacturing method includes a first exposure step for executing a multiple exposure of a first layer of a substrate by use of plural first masks, a development step for developing the first layer of the substrate and a second exposure step, executed after the development step, for executing a multiple exposure of a second layer of the substrate by use of plural second masks. A portion of at least one of the first masks has a pattern the same as a pattern formed in a portion of at least one of the second masks.

11 Claims, 10 Drawing Sheets

DEVICE MANUFACTURING METHOD

FIELD OF THE INVENTION AND RELATED ART

This invention relates to a device manufacturing method usable for the manufacture of various electronic devices such as semiconductor chips (e.g., ICs or LSIs), display devices (e.g., magnetic heads) or image pickup devices (e.g., CCDs), for example.

The density and speed of a semiconductor integrated circuit have been increased more and more, and the linewidth of an integrated circuit pattern has been narrowed more and more. This requires further improvements in semiconductor manufacturing methods. In some exposure apparatuses to be used for resist pattern formation in a lithographic process, among various semiconductor manufacturing processes, very short wavelengths of X-rays or extreme ultraviolet rays such as a KrF laser (248 nm), an ArF laser (193 nm), or an $F_2$ laser (157 nm) are used.

In an exposure process using extreme ultraviolet rays, mainly a reduction exposure of ¼–⅕ is performed. A mask or reticle (original) is therefore formed with a pattern of a size magnified by 4× or 5× as compared with a pattern to be produced on a semiconductor wafer (substrate to be exposed). In a unit-magnification X-ray proximity exposure process, on the other hand, an X-ray mask (original) is formed with a pattern of the same size as a pattern to be produced on a substrate.

Conventionally, one mask is used for exposure of a single layer upon a substrate. With this method, however, even if the exposure wavelength is shortened, there occurs an error (to be described later) which could not be disregarded in connection with the resolution and positional precision required, and it creates a limitation to the resolution and positional precisiion.

First, as regards an electron beam patterning apparatus which is used in the manufacture of originals, since the electron beam irradiation position is controlled by applying an electromagnetic field or electrostatic field to an electron beam to cause deflection thereof, the controllability of an electric voltage to be applied to a deflector is influential to the pattern position control. Further, depending on the flatness (irregularity) of a workpiece to be patterned, a pattern position distortion occurs.

In an exposure process using extreme ultraviolet rays, since the exposure process is performed by use of an original having been manufactured by use of an electron beam patterning apparatus such as described above, in addition to the positional distortion of the original itself, there occurs a pattern position distortion on a wafer due to aberrations produced in a projection optical system.

In an X-ray proximity exposure process, in addition to the positional distortion of an original itself produced by an electron beam patterning apparatus, there occurs a distortion of an X-ray mask. That is, usually, in an X-ray mask, a pattern of an X-ray absorptive material having a thickness of about 0.4 micron is formed on an X-ray transmissive film having a thickness of about 2 microns, for example. Due to a stress distribution of the transmissive film or to a stress of the absorptive material, a positional distortion occurs. Further, during the X-ray proximity exposure process, since the X-ray beam is not a completely parallel beam, there occurs a distortion, called a runout error.

Japanese Published patent Application No. 11-143085, filed by the same assignee of the subject application, proposes an exposure method which assures pattern formation of a higher resolution and a higher positional precision, as compared with those attainable currently, by use of a mask that can be produced by current techniques and an exposure apparatus currently available. In this exposure method, a fine pattern exposure and a rough pattern exposure are performed superposedly (by dual or multiple exposure) upon a layer on a substrate, to thereby assure enhancement of resolution. This method will be briefly explained below.

The fine pattern exposure is an exposure process for a pattern having a periodic structure. To a layer on a substrate having a fine pattern photoprinted thereon, a rough pattern having a desired pattern corresponding to those portions to be left is printed by dual or multiple exposures. Then, a development process is performed thereto, under a condition by which the fine pattern at those portions (positions) having been exposed to the rough pattern remain. The fine pattern exposure amount and the rough pattern exposure amount are determined at a ratio by which a best resist pattern is obtainable.

In accordance with such a dual or multiple exposure method described above, as compared with a conventional exposure method wherein one original is used for exposure of a single layer on a substrate, the influence attributable to the problems described hereinbefore can be reduced and, therefore, the resolution and positional precision can be improved.

SUMMARY OF THE INVENTION

It is an object of the present invention to provide a device manufacturing method by which a pattern registration precision between layers on a substrate in a multiple exposure process (including a dual exposure process) can be increased, such that a pattern can be produced with higher resolution and precision.

In accordance with an aspect of the present invention, there is provided a device manufacturing method including a process for exposure of a first layer on a substrate and a process for exposure of a second layer on the substrate, wherein each exposure of the first and second layers is performed by use of a plurality of originals, and wherein at least one of the originals to be used for exposure of the first layer has the same design rule as that of at least one of the originals to be used for exposure of the second layer.

The masks having the same design rule may be an identical mask to be used for exposures of both the first and second layers.

At least a portion of the first or second layer may be exposed by use of at least one of an X-ray, an ultraviolet ray, an extreme ultraviolet ray, and an electron beam.

Each of the first and second layers may be exposed superposedly by use of a fine pattern original having a relatively fine pattern and a rough pattern original having a relatively rough pattern.

Each fine pattern to be printed on the first and second layers may have a periodic structure. Each rough pattern to be printed on the first and second layers may comprise different patterns.

In the present invention, for dual or multiple exposures of different layers on a substrate, at least one pattern for each layer includes a portion having a common design rule. As a result of it, the pattern registration precision between different layers can be improved significantly. Thus, with the present invention, a pattern can be produced at higher resolution and precision, with a good registration precision between different layers.

As regards plural originals (masks or reticles) to be used in the present invention, at least two originals may be used, including, for example, a first original for printing a fine pattern having a relatively small minimum linewidth upon a layer on a substrate and a second original for printing a rough pattern, formed with a target precision corresponding to a minimum linewidth larger than that of the fine pattern.

The term "first layer" referred to in this specification is not limited to a layer first provided on a bare wafer. It may include an initial layer of two or more layers to be provided superposedly. The term "second layer" refers to a layer which is superposedly provided after formation of a "first layer". Further, it is not always necessary that a "first layer" and a "second layer" are formed successively. Namely, after a certain layer is formed subsequent to formation of a "first layer", a "second layer" may be formed superposedly on the "first layer".

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described.

In the preferred embodiments of the present invention to be described below, upon different layers on a substrate such as a semiconductor wafer or a glass plate, a relatively fine pattern and a relatively rough pattern are superposedly photoprinted.

In regard to formation of a first layer on a substrate, a resist material on the substrate for the first layer is exposed by dual exposure, comprising a fine pattern exposure and a rough pattern exposure, by which a resist pattern as required for the first layer is transferred to the substrate. The position of the resist pattern to be resolved here is strongly dependent upon the position of the fine pattern image as transferred. This is because a latent image as formed on the resist corresponds to the superposition of a fine pattern image and a rough pattern image, and such a portion of the latent image as having an exposure intensity higher than a certain threshold remains there as a resist pattern.

A second layer to be formed on the substrate is also produced by dual exposure, comprising a fine pattern exposure and a rough pattern exposure. As a matter of course, the resist pattern of the second layer is strongly dependent upon the position of the fine pattern used in the exposure of the second layer.

A fine mask to be used for formation of a fine pattern of a second layer may be a mask having a portion of the same design as that of a mask having been used for formation of a fine pattern image of a first layer. Alternatively, it may be the same mask as has been used for formation of the fine pattern image of the first layer. By using such a mask, a fine pattern image of the second layer is printed.

With this procedure, it results in that the final pattern position of the first and second layers depends on the position of the fine patterns of the same structure. As a consequence, the pattern registration precision of the first and second layers increases significantly. When the same mask is used for exposure of the fine pattern image of the second layer, the registration precision increases more.

For each layer, either the fine pattern exposure or the rough pattern exposure may be made first. When X-ray proximity exposure is to be performed, a second original for rough pattern exposure may be one which differs from a first original for fine pattern exposure with respect to the type of absorptive material or the thickness thereof. They may be determined to satisfy a condition for attaining a desired rough pattern.

In a multiple exposure process (including a dual exposure process), an exposure region may be divided in accordance with a fine pattern, and a range of divided zones may be selected in accordance with a rough pattern. A resist pattern after development is strongly dependent upon the precision of the fine pattern.

EXAMPLE 1

A first example will be described below in conjunction with some of the drawings. In this example, the invention is applied to a device manufacture wherein a channel-shaped gate electrode layer of polysilicon (first layer) is formed through a proximity X-ray exposure and wherein a wiring contact hole (second layer) is formed.

The first layer formation will be described in regard to a fine pattern exposure for a first layer and a rough pattern exposure for the first layer, separately.

(First Layer Fine Pattern Exposure)

Figure 1A:
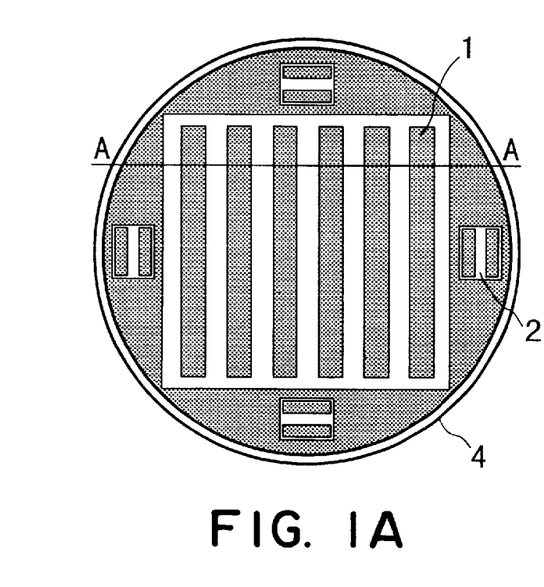
FIG. 1A is a schematic view of a fine mask for a first layer.

FIG. 1A shows a fine mask 4 wherein a fine pattern 1 of a periodic structure is formed at a central portion (exposure picture angle) while alignment marks 2 are formed around it. As regards the structure of the fine pattern 1, it comprises a periodic pattern defined by lines and spaces. The section of the fine mask 4 has a structure such as shown in FIG. 1C. The fine pattern 1 comprises an absorptive material such as W (tungsten) for absorbing X-rays, and a mask membrane 3 such as SiC for supporting it.

Figure 1B:
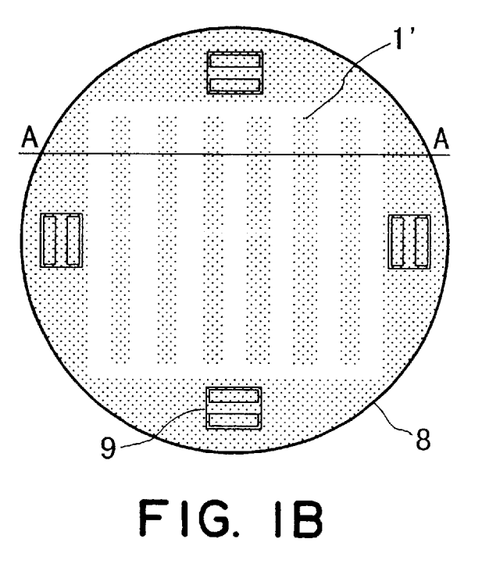
FIG. 1B is a schematic view of a wafer having been exposed to the fine mask for the first layer.
Figure 1C:
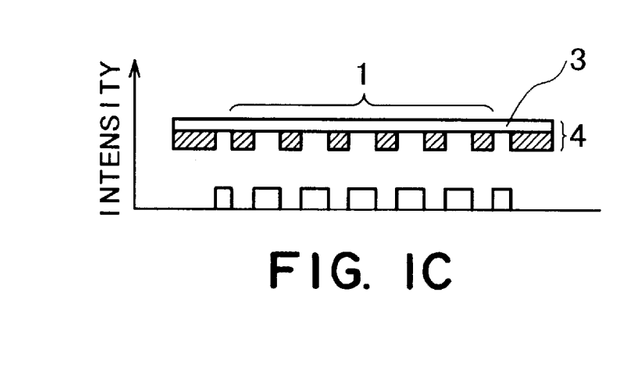
FIG. 1C is a schematic view of an exposure intensity distribution provided by the fine mask for the first layer.
Figure 3A:
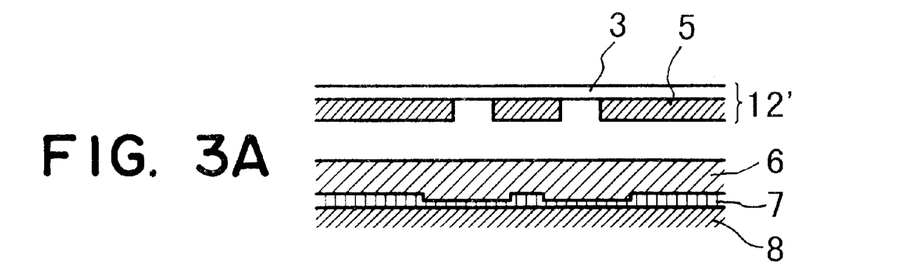
FIG. 3A is a schematic view for explaining an exposure process with a rough mask for a first layer.

FIG. 1B shows a wafer 8 which is a substrate to be exposed. A positive type resist material is applied to the surface thereof to be exposed. There are alignment marks 9 around the exposure picture angle, which marks have been formed there through preceding exposure and etching processes, for example. Further, as shown in FIG. 3A, there is a $SiO_2$ layer 7 already formed on the wafer 8.

In the structure described above, an alignment operation is performed for alignment between the alignment marks 2 and 9 of the fine mask 4 and the wafer 8, and then X-rays are projected from above the mask 4. The X-rays are blocked by those areas where an X-ray absorptive material is present and, as shown in FIG. 1B. X-rays passing through the remaining areas are absorbed by the resist, whereby a latent image (invisible image) 1' of the fine pattern 1 is formed there. The intensity distributions at each section A—A in FIGS. 1A and 1B are such as shown in FIG. 1C. FIG. 1C shows an exposure amount distribution and a fine pattern corresponding to it.

(First Layer Rough Pattern Exposure)

Subsequent to the fine pattern exposure of the first layer, a rough pattern exposure is performed without intervention of a development process.

Figure 2:
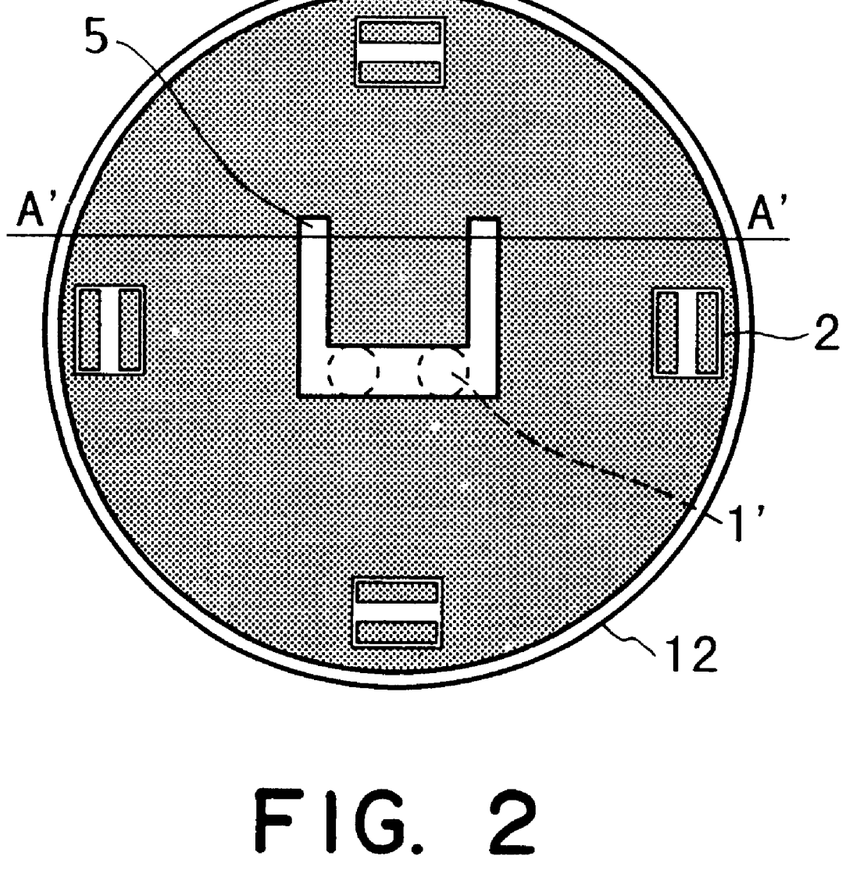
FIG. 2 is a schematic view of a rough mask for a first layer.

FIG. 2 shows a rough mask 12 having a rough pattern 5 which is formed with a desired shape, at its central portion thereof. There are alignment marks 2 around the mask. FIG. 3A is a sectional view corresponding to a section A'—A' in FIG. 2 in an exposure process. Like the fine mask 4, the rough mask 12 has a rough pattern 5 made of an X-ray absorptive material such as W (tungsten), and a mask membrane 13. A wafer which is to be exposed here has an $SiO_2$ layer 7 already formed thereon.

Figure 4A:
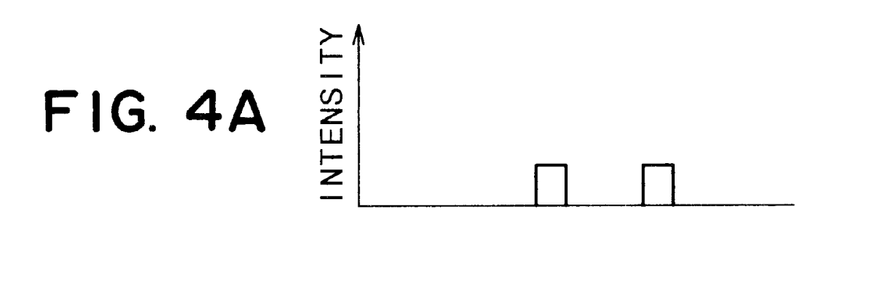
FIG. 4A is a schematic view of an exposure intensity distribution provided by a rough mask for a first layer.
Figure 4B:
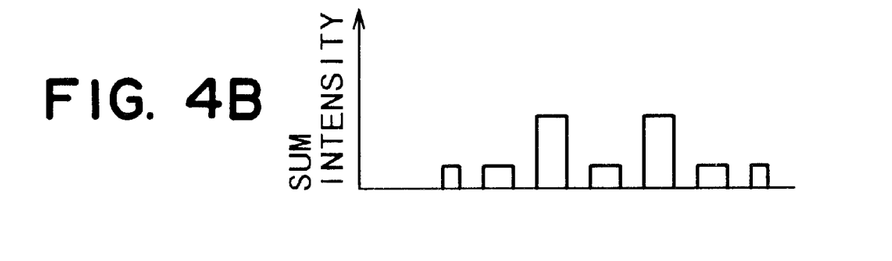
FIG. 4B is a schematic view of an exposure intensity distribution on the first layer.

In the structure described above, an alignment operation is performed for alignment between the alignment marks 2 and 9 of the rough mask 12 and the wafer 8, and then X-rays are projected from above the mask 12. FIG. 4A shows an intensity distribution upon the mask 12, as produced by this exposure process. The intensity distribution provided by the rough pattern as shown in FIG. 4A is accumulated on the intensity distributions (FIG. 1C) of the fine pattern already formed as a latent image, such that a combined intensity distribution (FIG. 4B), i.e., an exposure amount distribution, is produced as a latent image of the first layer.

The alignment marks 9 of the wafer 8 are to be used again in exposure of a second layer. For this reason, during the fine pattern exposure and the rough pattern exposure, an X-ray blocking plate (masking blade) is used to prevent exposure of these alignment marks 9 with X-rays.

Figure 3B:
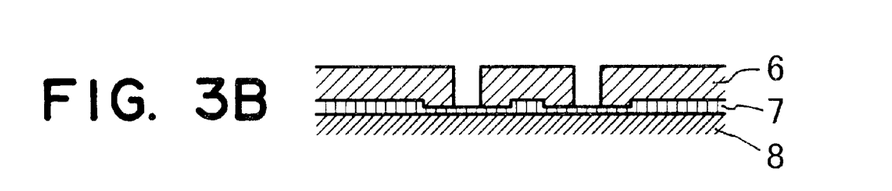
FIG. 3B is a schematic view of a resist pattern on the first layer.
Figure 3C:
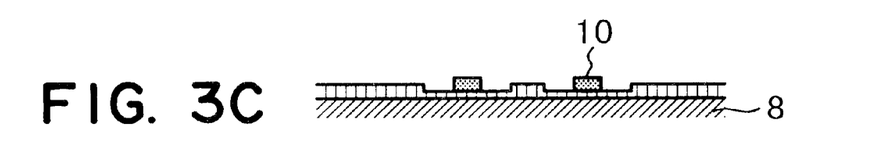
FIG. 3C is a schematic view of the first layer.

The exposure process described above uses a positive type resist. The resist material in a portion exposed with a large exposure amount is solved and removed. By setting an appropriate developing time, the resist can be solved into the shape of the rough pattern 5 as shown in FIG. 3B, such that the $SiO_2$ layer 7 can be uncovered. Subsequently, a polysilicon layer is formed by a lift-off method and, thereafter, the resist is peeled, whereby a structure such as shown in FIG. 3C is produced.

Here, there is a possibility that the exposure amount in a portion of a lateral bar of the channel-shaped rough pattern shown in FIG. 2 is insufficient so that the resist is not completely solved. On that occasion, in order to increase the exposure amount in such a portion of the lateral bar, a second rough mask may be used to enlarge the exposure amount only in that portion.

(Second Layer Fine Pattern Exposure)

Figure 5A:
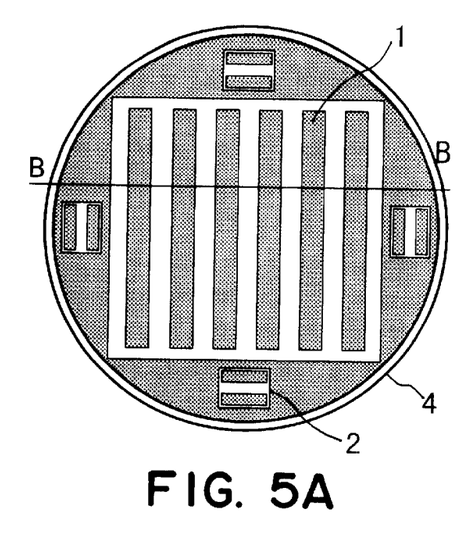
FIG. 5A is a schematic view of a fine mask 1 for a second layer.
Figure 5B:
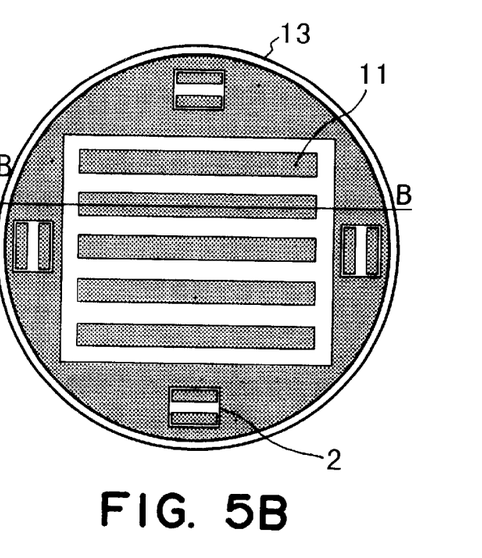
FIG. 5B is a schematic view of a fine mask 2 for the second layer.
Figure 5C:
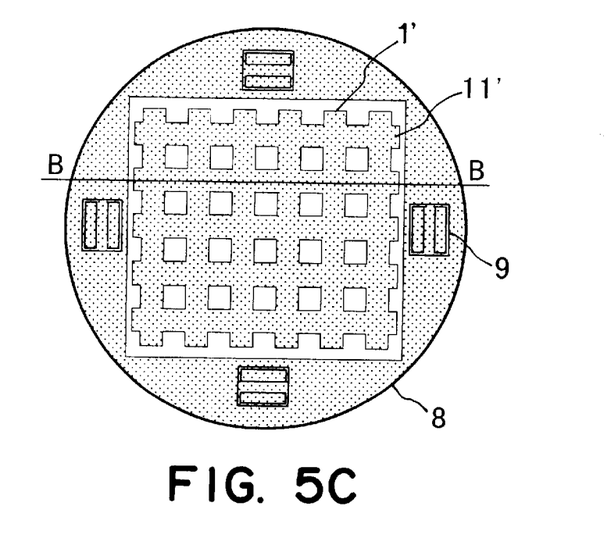
FIG. 5C is a schematic view of an exposure intensity distribution provided by the fine mask for the second layer.

FIG. 5A shows the same fine mask 4 having been used for the first layer (FIG. 1A). FIG. 5B shows a fine mask 13 having a fine pattern 11 extending orthogonally to that of FIG. 5A. Like the fine mask 4 of FIG. 5A, it is formed with an alignment mark 2 around the same. FIG. 5C shows a wafer 8 to be exposed, and it has a surface being coated with a negative type resist material. The first layer process has already been done, to this wafer.

Figure 7A:
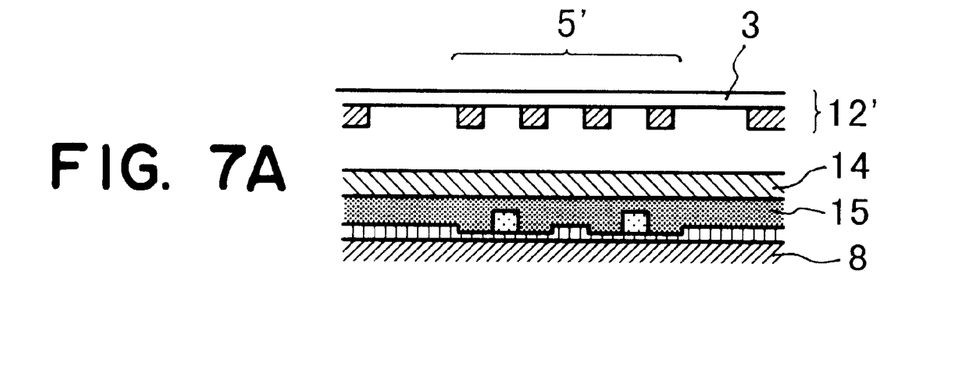
FIG. 7A is a schematic view for explaining an exposure process with a rough mask.

After formation of a polysilicon gate electrode (first layer) described above, an $SiO_2$ layer 15 (insulating layer) is formed over the whole wafer surface (FIG. 7A). Since the alignment marks 9 are not damaged during formation of the first layer, the same alignment marks 9 can be used for exposure of the second layer.

First, the mask 4 of FIG. 5A is used, and an alignment operation is performed for alignment between the alignment marks 2 and 9 of the fine mask 4 and the wafer 8, and then X-rays are projected from above the mask 4. Here, as shown in FIG. 5C, X-rays pass through those areas without a mask absorptive material, such that a latent image 1' (invisible image) of the fine pattern 1 is produced on the resist of the wafer 8.

Subsequently, the mask 13 of FIG. 5B is used, and an alignment operation is performed for alignment between the alignment marks 2 and 9 of the fine mask 13 and the wafer, and then X-rays are projected from above the mask 13. Like the exposure of the mask 4, a latent image 11' of the fine pattern 11 is produced.

Figure 5D:
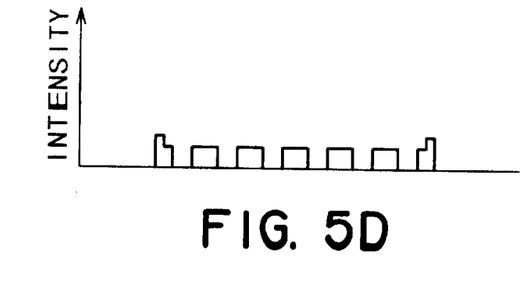
FIG. 5D is a schematic view of a wafer having been exposed to the fine mask for the second layer.

With these dual exposures, there is produced an exposure intensity distribution of three levels, corresponding to a position exposed by X-rays through the mask 4 exposure and the mask 13 exposure, a position exposed by X-rays through only one of them, and a position not exposed by X-rays through them. FIG. 5D shows the result. More specifically, FIG. 5D shows an exposure intensity distribution, corresponding to sections each along a line B—B in FIGS. 5A, 5B and 5C. The position on the wafer 8 surface is taken on the axis of the abscissa, while the total exposure intensity is taken on the axis of the ordinate.

(Second Layer Rough Pattern Exposure)

Figure 6:
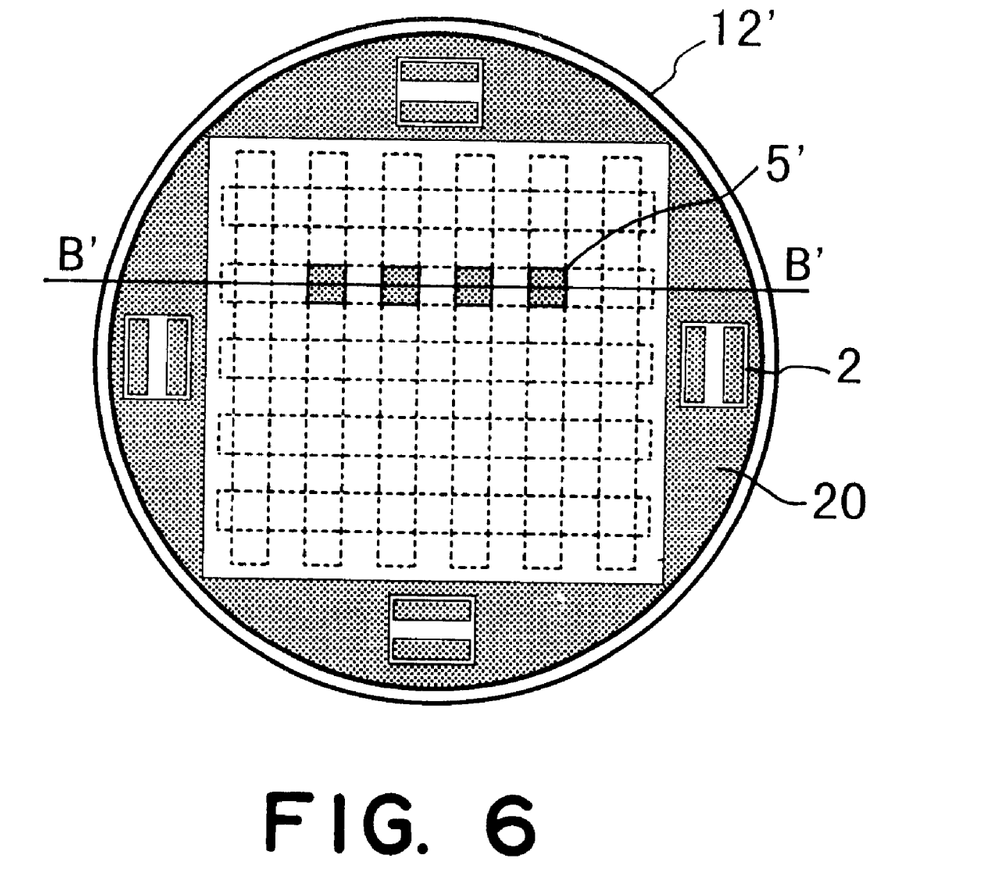
FIG. 6 is a schematic view of a rough mask for a second layer.

Subsequent to the fine pattern exposure of the second layer, a rough pattern exposure is performed without intervention of a development process. FIG. 6 shows a rough mask 12' for a second layer. There is an absorptive material 20 at a region within the picture angle, where a contact hole is to be formed. Alignment marks 2 are formed outside the picture angle.

After adjusting alignment between the alignment marks 2 and 9 of the rough mask 12' and the wafer 8, X-rays are projected from above the rough mask 12'. FIG. 7A shows the section along a line B'—B' in FIG. 6 in the exposure process. The exposure intensity distribution as obtainable with the rough mask 12' only is such as shown in FIG. 8A.

Figure 8A:
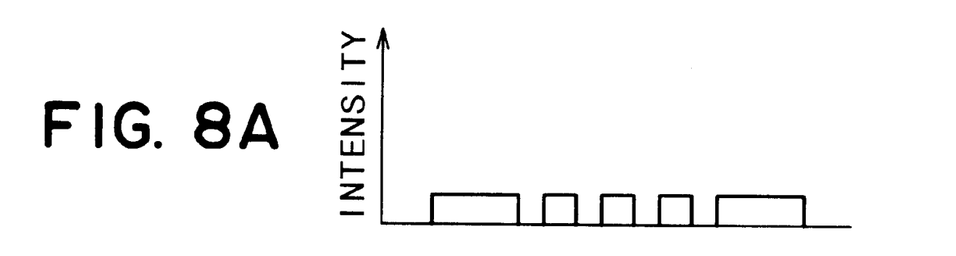
FIG. 8A is a schematic view of an exposure intensity distribution provided by a rough mask.
Figure 8B:
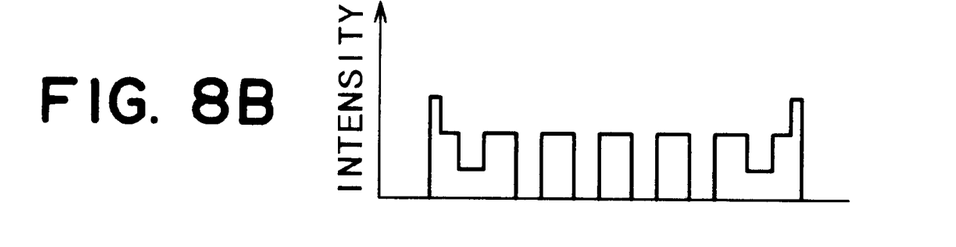
FIG. 8B is a schematic view of an exposure intensity distribution on a second layer.

Those portions with lower exposure intensity shown in FIG. 8A are the areas where contact holes are to be produced, and they correspond to the absorptive material positions on the mask 12'. These positions just correspond to the low exposure intensity positions of the fine mask. Thus, an exposure intensity distribution as provided by combining the exposure intensity distribution (FIG. 5D) through the fine mask exposure and the exposure intensity distribution (FIG. 8A) through the rough mask exposure, will be such as shown in FIG. 8D. The intensity at the position where a contact hole is to be formed is lowest.

Figure 7B:
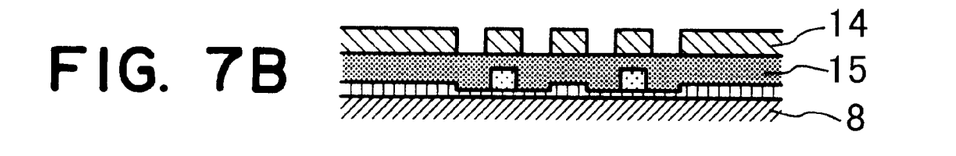
FIG. 7B is a schematic view of a resist pattern on a second layer.

The ratio between the rough mask exposure amount and the fine mask exposure amount is determined to avoid that a negative type resist only at the position corresponding to a contact hole is left. A resist pattern 14 defined after a development process is such as shown in FIG. 7B.

In a subsequent process, while using the thus patterned resist 14 as a mask, the insulating layers 15 and 7 are etched, and contact holes are produced.

The mask and wafer positioning will be described in detail. In order to assure that a second layer to be exposed through the masks of FIGS. 5A, 5B and 6 is accurately superposed upon a first layer to be exposed through the masks 4 and 12 of FIGS. 1A and 2, with a high precision, the fine mask 4 of FIGS. 1A and 5A should be superposedly transferred very precisely.

In this embodiment, since the masks of FIGS. 1A and 5A are identical (one and the same mask), if the first layer is not a layer first formed on a bare wafer, during the first-layer and second-layer exposures, the mask alignment marks 2 are brought into alignment with respect to wafer alignment marks 9 having been formed on a layer before exposure of the first layer. With this procedure, exact alignment can be accomplished.

When the masks of FIGS. 1A and 5 are different masks but having the same design rule regions, while the error in the mask manufacture may be enlarged as compared with the case wherein one and the same mask is used, high precision alignment can be accomplished essentially in the same way.

If the first layer is a layer to be first formed on a bare wafer, the masks 4 and 12 may be brought into alignment beforehand, with respect to alignment marks provided on a reference table of an exposure apparatus, such that the alignment of the masks 4 and 12 can be assured. Then, each mask is placed at the exposure position, and the exposure process is performed.

As regards the alignment marks 2, there are two types of marks, that is, an alignment mark for producing an alignment mark upon a wafer, and an alignment mark for aligning a mask with respect to an alignment mark formed on a wafer. In the second layer exposure, a mask alignment mark is aligned with respect to an alignment mark formed through exposure of the first layer, to accomplish the mask-to-wafer alignment.

The alignment method for the first and second layers described above is applicable not only to a case wherein the first layer is a layer to be produced on a bare wafer first. When the same or common mask as shown in FIGS. 1A and 5A is used, alignment marks for producing alignment marks on a wafer, as well as alignment marks for aligning a mask with alignment marks formed on the wafer, can be provided in juxtaposition with each other, and the positional relation of them can be set very precisely. Therefore, two layers can be aligned and registered with higher precision.

As regards the alignment of a rough pattern, it can be aligned with good precision by aligning the same with respect to alignment marks for aligning the fine pattern.

In accordance with this embodiment, the positions of the rough pattern 5 of the first layer and the rough pattern 5' of the second layer both strongly depend on the position of the fine pattern 1 of the common mask 4.

Further, since both of these layers are aligned with respect to the alignment marks 9 on the same wafer 8, the alignment error becomes very small. For this reason, even if the position of the fine pattern 1 of the mask 4 is deviated from a predetermined position, the positions of the rough patterns of the first and second layers also shift the same as the deviation, and thus the registration precision between these layers increases.

While in this embodiment a common mask 4 is used for both layers, it is not always necessary that one and the same fine pattern is used for plural layers. Different masks may be used, provided that the same structure (design rule) is defined in at least a portion of the fine patterns, where high precision registration is required.

EXAMPLE 2

A description will now be made of an example wherein a fine pattern is present at a central portion of first and second layers and wherein a large pattern is present in a peripheral portion of a picture angle of the second layer.

(First Layer Formation)

Figure 9A:
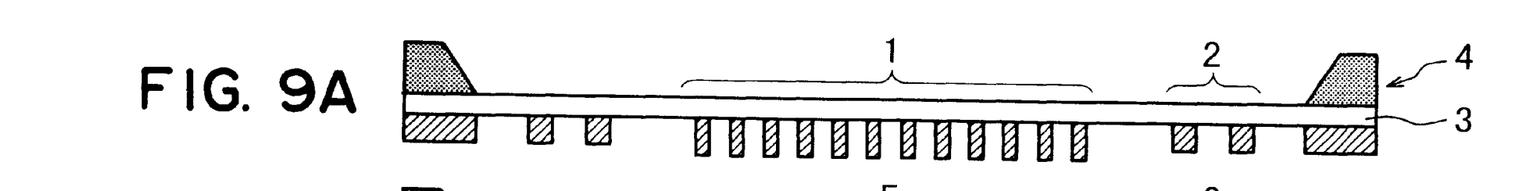
FIG. 9A is a schematic view of a fine mask for a first layer in another example.
Figure 9B:
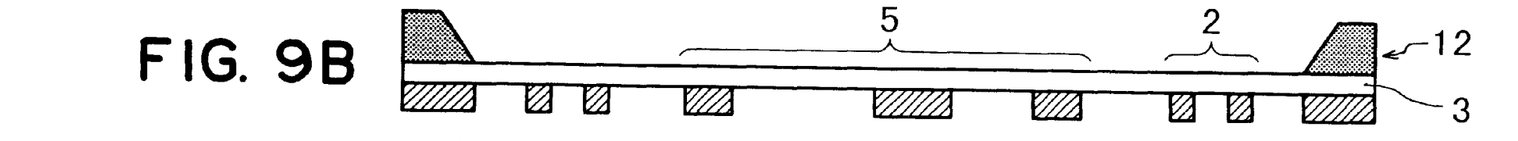
FIG. 9B is a schematic view of a rough mask for the first layer.

FIG. 9A shows a fine mask 4 (first mask) for a first layer, and it has a fine pattern 1 of periodic structure formed at a central portion (picture angle) of the mask. There are alignment marks 2 formed outside the picture angle. FIG. 9B shows a rough mask 12 (second mask) for the first layer, and it has a rough pattern 5 formed at a central portion (picture angle) of the mask. There are alignment marks 2 formed outside the picture angle.

In this embodiment, an intensity distribution of a fine pattern image, of a period a half of the period of the fine pattern 1, is produced. This can be accomplished by controlling the spacing between the mask 1 and a wafer so that the same X-ray intensity is provided at the center of an absorptive material of the fine pattern and at the center of the opening.

The rough pattern 5 inside the picture angle of the rough mask 12 for the first layer consists of a relatively fine pattern formed over the whole surface thereof. Thus, a dual or multiple exposure with the fine pattern 1 is preferable since then the resolution increases within the whole picture angle. The fine pattern 1 of the mask 4 is therefore formed throughout the picture angle region.

Figure 9C:
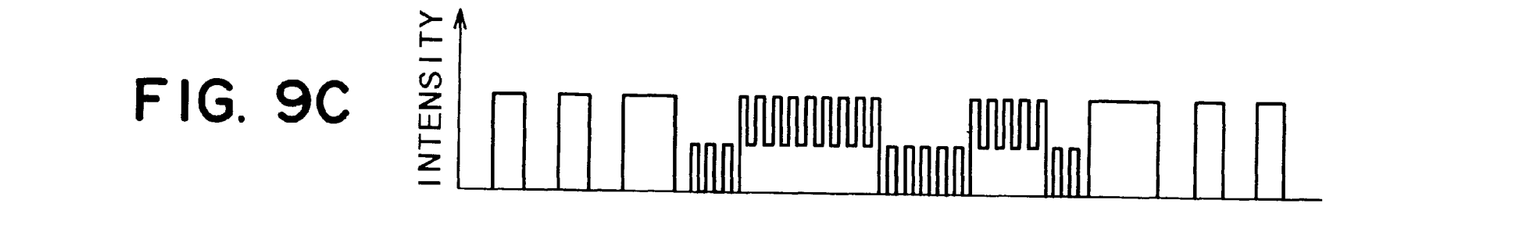
FIG. 9C is a schematic view of an exposure intensity distribution on the first layer.

An intensity distribution to be produced by a dual or multiple exposure of the fine mask 4 and the rough mask 2 will be such as shown in FIG. 9C.

(Second Layer Formation)

Figure 10A:
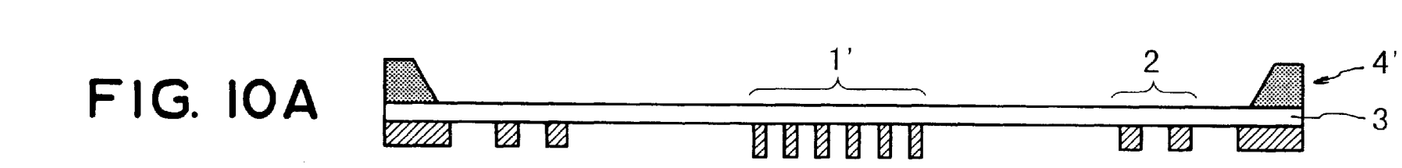
FIG. 10A is a schematic view of a fine mask for a second layer in another example.
Figures 10B, 10C:
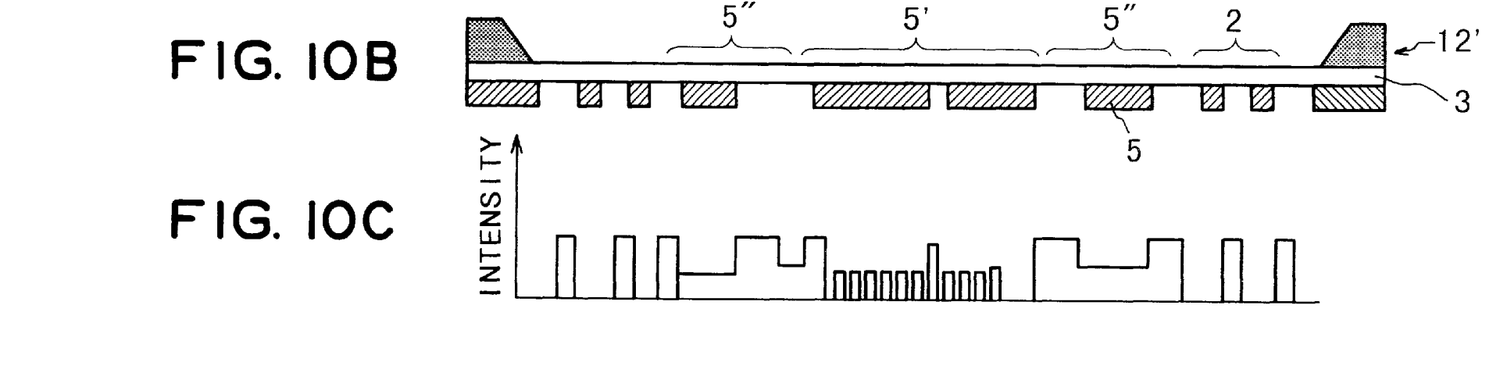
FIG. 10B is a schematic view of a rough mask for the second layer.
FIG. 10C is a schematic view of an exposure intensity distribution on the second layer.

FIG. 10A shows a fine mask 4' for a first layer, and it has a fine pattern 1' of a predetermined periodic structure formed at a central portion (picture angle) of the mask. There are alignment marks 2 formed outside the picture angle. FIG. 10B shows a rough mask 12' for the first layer, and it has rough patterns 5' and 5" formed within the picture angle of the mask. There are alignment marks 2 formed outside the picture angle.

The rough pattern in the picture angle of the rough mask 12' for the second layer includes a relatively-fine rough pattern 5' at the center of the picture angle, and a relatively-large rough pattern 5" at a peripheral portion thereof. In the case of a mask having such a structure, it is preferable that only the central portion of the picture angle, that is, only the region of the rough pattern 5' is exposed by a dual or multiple exposure with the fine pattern 1', for enhancement of resolution.

In consideration of it, a fine mask 12' having a fine pattern 1' only in the region corresponding to the region of the relatively-fine rough pattern 5' and having no such fine pattern 1' in the region corresponding to the relatively-large rough pattern 5" in the peripheral portion (so that an ordinary exposure is carried out), is used for fine pattern exposure of the second layer.

An intensity distribution to be produced by a dual or multiple exposure of the fine mask 4' and the rough mask 12' will be such as shown in FIG. 10C.

In this exposure method, at the central portion of the picture angle where a fine pattern for a second layer is present, the fine mask 4 for the first layer and the fine mask 4' for the second layer have fine patterns of the same design rule. Also, the fine patterns of these layers to be produced are dependent upon the position of the fine pattern. Therefore, the registration precision between these fine patterns increases.

As regards the rough pattern exposure, a large rough pattern 5" at the peripheral portion of the picture angle and a relatively-fine rough pattern 5' at the central portion of the picture angle may be printed by multiple exposure, using separate rough masks.

As described hereinbefore, in regard to fine masks to be used for the first-layer and second-layer exposures, it is not necessary that the same fine patterns are formed throughout the whole surfaces of fine masks. When patterns of the same design rule are provided at least in a portion of each mask, the registration precision between two layers increases.

In the second example described above, the fine mask 4' used for exposure of the layer 2 does not have a fine pattern 1' in its peripheral region where the large pattern is present. It is a possible alternative that the same fine mask 4' is used for exposures of two layers while, in the exposure of the second layer with the fine pattern 1, the peripheral portion of the picture angle of the fine mask 4 is covered by a blocking plate, so that the fine pattern exposure is performed while preventing the peripheral portion being irradiated with X-rays. On that occasion, since no fine pattern is transferred to the region where the large pattern 5" of the rough mask 12' is present, the result is transfer of only the large pattern 5". Thus, advantageous effects such as those of the second example are attainable.

Next, a description will be made of exposure means. In the examples described hereinbefore, the invention is applied to a proximity X-ray exposure process. However, the invention is applicable also to various exposure processes such as, for example, a DUV exposure process using extreme ultraviolet rays such as an excimer laser (e.g., an ArF excimer laser), an X-ray reduction projection exposure process using soft X-rays and a reflection type mask, an electron beam simultaneous exposure process wherein an electron beam is projected to a stencil mask and wherein a transmitted electron beam is reduced, and an ion beam exposure process wherein an ion beam is projected in place of an electron beam.

A fine mask to be used in such various exposure processes may comprise a mask having an absorptive material formed into a line-and-space shape as described in the first example, or alternatively, it may be a mask using a phase shift. For example, in an extreme ultraviolet exposure process, a mask such as a Levenson type mask, having such a structure that the phase changes periodically, may be used to form a fine pattern on a wafer.

As described hereinbefore, each layer is produced by superposition of a fine pattern and a rough pattern. These layers may be formed by using different exposure methods. This is because, in general, while resist materials have different sensitivities, each has a sensitivity to light rays, electrons and X-rays. Therefore, even if the same resist is irradiated by different types of beams, exposure amounts by them can be combined. As an example, fine patterns of plural layers may be printed by X-ray proximity exposures while the rough pattern transfer may be performed by DUV exposure.

Next, an embodiment of a semiconductor device manufacturing method which uses an exposure method such as described above, will be explained.

Figure 11:
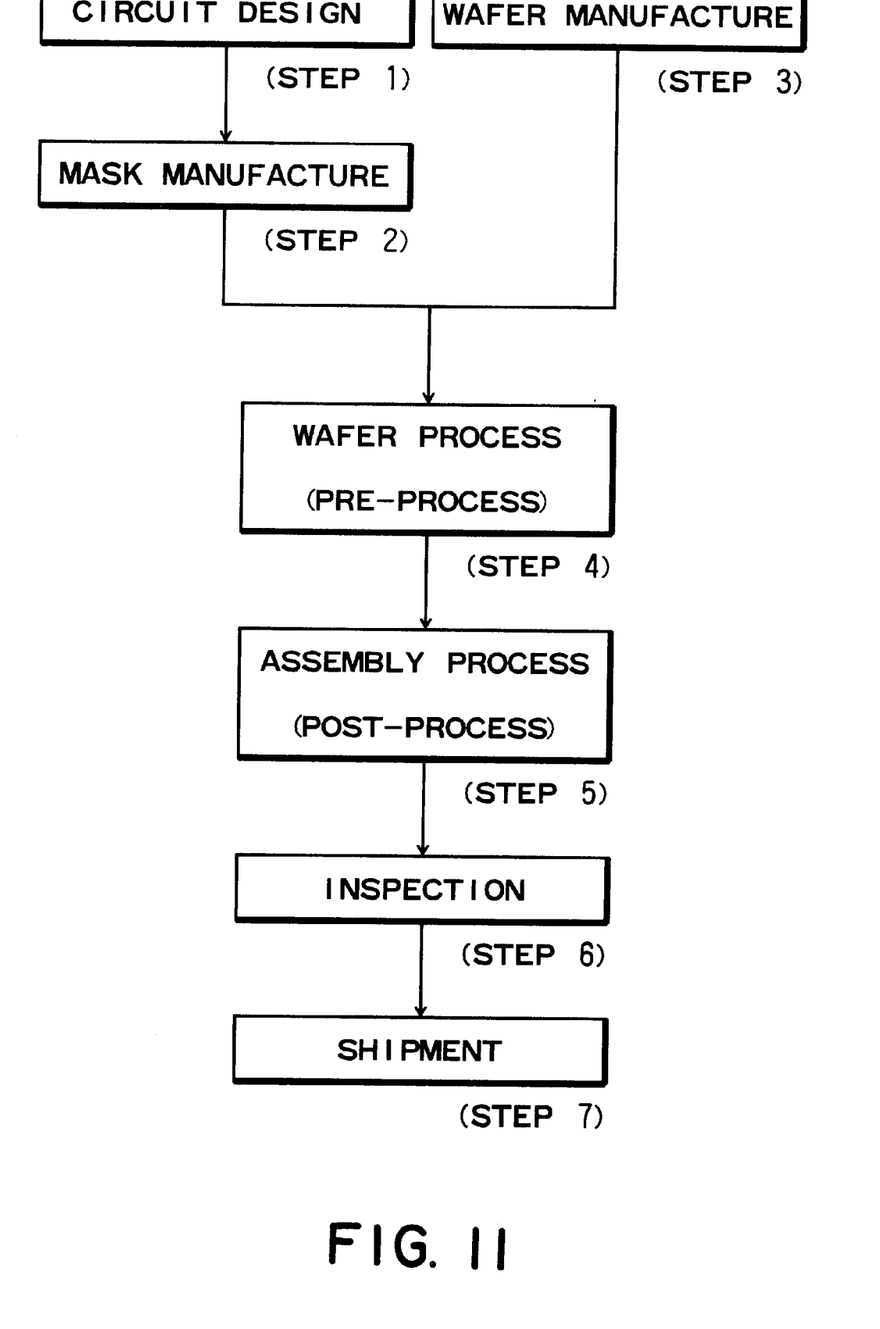
FIG. 11 is a flow chart of semiconductor device manufacturing processes.

FIG. 11 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processing by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5. are carried out. With these processes, semiconductor devices are completed and they are shipped (step 7).

Figure 12:
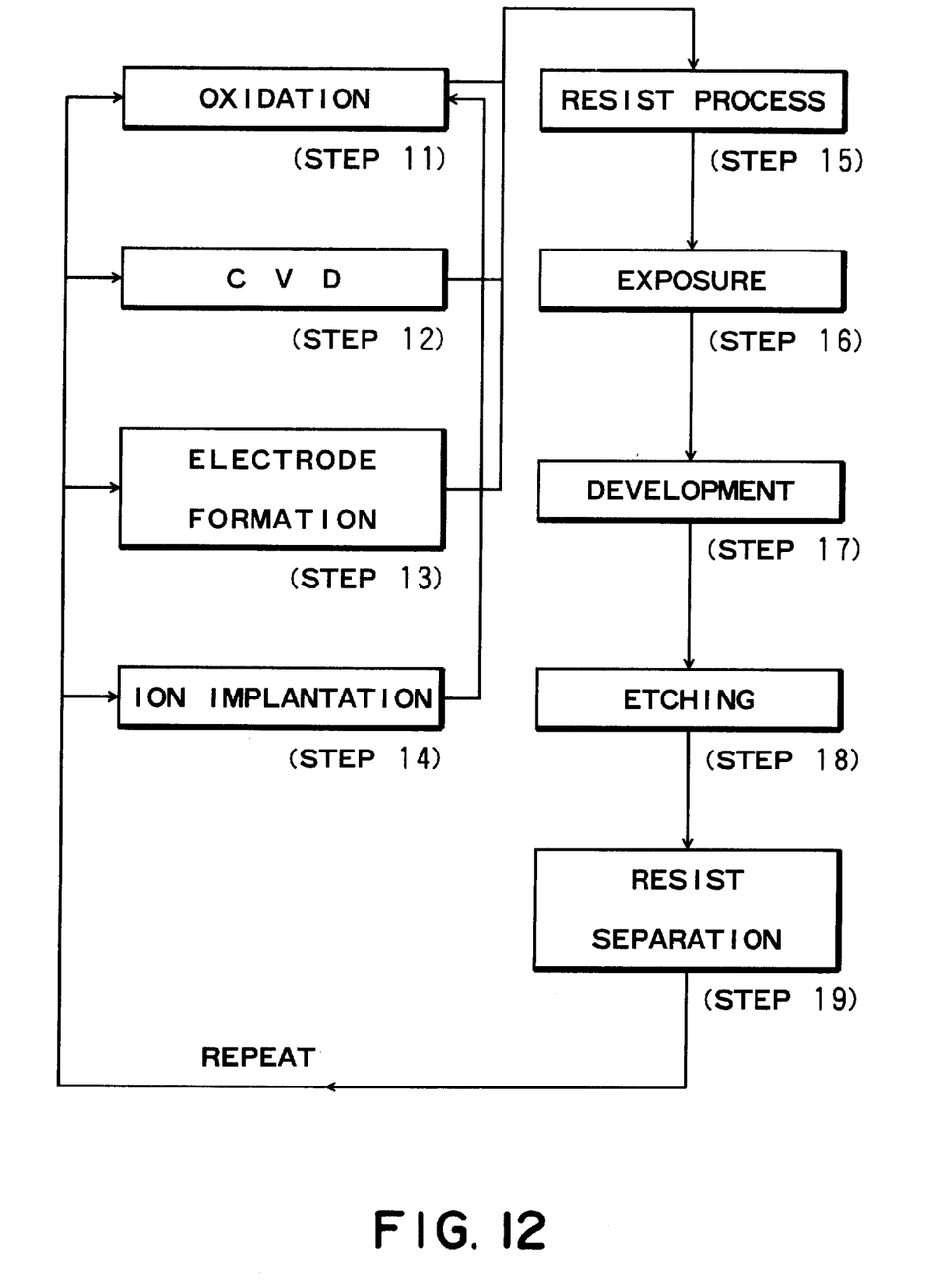
FIG. 12 is a flow chart for explaining details of a wafer process.

FIG. 12 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A device manufacturing method, comprising:
    a first exposure step for performing a multiple exposure to a first layer on a substrate by use of a plurality of first masks, wherein at least a portion of a region exposed by one of the plurality of first masks is exposed by use of another first mask;
    a development step; and
    a second exposure step, executed after said development step, for performing a multiple exposure to a second layer on the substrate by use of a plurality of second masks, wherein at least a portion of a region exposed by use of one of the plurality of second masks is exposed by use of another second mask, wherein said development step is performed between said first and second exposure steps, and a portion of at least one of the first masks has a pattern that is the same as a pattern formed in a portion of at least one of the second masks.

2. A method according to claim 1, wherein the at least one of the first masks is the same as the at least one of the second masks.

3. A method according to claim 1, further comprising performing said first and second exposure steps by use of at least one of ultraviolet rays, extreme ultraviolet rays, X-rays, electron beams and ion beams.

4. A method according to claim 1, wherein the first masks include a first fine mask and a first rough mask, and the second masks include a second fine mask and a second rough mask.

5. A method according to claim 4, wherein a portion of the first fine mask has a pattern that is the same as a pattern formed in a portion of the second fine mask.

6. A method according to claim 5, wherein the portion of the first fine mask and the portion of the second fine mask have a periodic pattern.

7. A method according to claim 4, wherein the first rough mask and the second rough mask are different from each other.

8. A method according to claim 4, wherein the first fine mask is the same as the second fine mask.

9. A method according to claim 1, further comprising performing at least one of a resist process, a development process, and an etching process for each of the first and second layers.

10. A method according to claim 1, further comprising performing a mask manufacturing process for manufacturing a mask, and an assembly process for the substrate for producing semiconductor chips.

11. A method according to claim 1, wherein the plurality of first masks includes a first fine mask and a first rough mask having a smallest linewidth greater than a smallest linewidth of the first fine mask, and wherein the plurality of second masks includes a second fine mask and a second rough mask having a smallest linewidth greater than a smallest linewidth of the second fine mask.

* * * * *

UNITED STATES PATENT AND TRADEMARK OFFICE
CERTIFICATE OF CORRECTION

PATENT NO.    : 6,645,707 B2
DATED         : November 11, 2003
INVENTOR(S)   : Mitsuaki Amemiya et al.

It is certified that error appears in the above-identified patent and that said Letters Patent is hereby corrected as shown below:

Title page,
Item [*] Notice, the following paragraph should be inserted:
-- This patent issued on a continued prosecution application filed under 37 CFR 1.53(d), and is subject to the twenty year patent term provisions of 35 U.S.C. 154(a)(2). --

Signed and Sealed this

Seventh Day of June, 2005

JON W. DUDAS
*Director of the United States Patent and Trademark Office*